(12) United States Patent
Lloret Portillo et al.

(10) Patent No.: US 8,954,312 B2
(45) Date of Patent: Feb. 10, 2015

(54) HARDWARE EMULATION PROXY FOR HARDWARE SOFTWARE CO-EMULATION

(75) Inventors: Luis Lloret Portillo, Cambridge (GB); Georges Antoun Elias Ghattas, Cairo (EG); Noah Wagdy Shawky Tadros, Cairo (EG)

(73) Assignee: Mentor Graphics Corporation, Wilsonville, OR (US)

( * ) Notice: Subject to any disclaimer, the term of this patent is extended or adjusted under 35 U.S.C. 154(b) by 498 days.

(21) Appl. No.: 13/159,378

(22) Filed: Jun. 13, 2011

(65) Prior Publication Data

US 2011/0307239 A1 Dec. 15, 2011

Related U.S. Application Data

(60) Provisional application No. 61/354,142, filed on Jun. 11, 2010.

(51) Int. Cl.
*G06F 9/455* (2006.01)
*G06F 17/50* (2006.01)
(52) U.S. Cl.
CPC ................... *G06F 17/5027* (2013.01)
USPC .......................................................... 703/28
(58) Field of Classification Search
USPC .......................................................... 703/28
See application file for complete search history.

(56) References Cited

PUBLICATIONS

Ghenassia (Ed.), Transaction Level Modeling with SystemC, TLM Concepts and Applications for Embedded Systems; STMicroelectronics, France; ISBN 13 978-0-387-26233-4 (e-book); 282 pages; 2005.*
SCE-API: A Breakthrough Common Emulation API; presentation SCE-API Consortium, 2001; 31 pages.*
Standard Co-Emulation Modeling Interface (SCE-MI) Reference Manual; Version 2.0 Release; Accellera product manual; 2007; 176 pages.*

* cited by examiner

*Primary Examiner* — Hugh Jones
(74) *Attorney, Agent, or Firm* — Klarquist Sparkman, LLP

(57) ABSTRACT

The invention provides for the interaction of an emulator emulating an electronic design having a communication bus communicating with a software application over the emulated communication bus. The interaction is facilitated in such a manner as to provide an appropriate latency for the emulated communication bus. According to various implementations of the invention, a protocol proxy is provided. The protocol proxy is designed to be emulated along with an electronic design and configured to communicate to software executing on a computer connected to the emulator. The protocol proxy includes a protocol module that communicates to the electronic design being emulated in the emulator environment. Furthermore, the protocol proxy includes a software control module that communicates to the software outside the emulator through proxy communication channels. Further still, the protocol proxy includes a data storage component.

13 Claims, 8 Drawing Sheets

FIGURE 6B ics of the electronic design. Subsequently, the electronic design and associated communication bus can be verified.

HARDWARE EMULATION PROXY FOR HARDWARE SOFTWARE CO-EMULATION

REFERENCE TO RELATED CASES

This application claims priority under 35 U.S.C. §119(e) to U.S. Provisional Patent Application No. 61/354,142 entitled "Emulator Protocol Proxy" filed on Jun. 11, 2010, and naming Luis Portillo et al. as inventors, which application is incorporated entirely herein by reference.

FIELD OF THE INVENTION

The present invention is directed towards emulating an electronic design. More particularly, various implementations of the invention provide a proxy communication interface between an emulator and a software application running on a computer.

BACKGROUND OF THE INVENTION

Electronic circuits, such as integrated circuits, are used in a variety of products, from automobiles to microwaves to personal computers. Designing and fabricating these circuit devices typically involves many steps, known as a "design flow." The particular steps of a design flow often are dependent upon the type of integrated circuit being designed, its complexity, the design team, and the integrated circuit fabricator or foundry that will manufacture the circuit. Typically, software and hardware "tools" will verify a design at various stages of the design flow by running software simulators and/or hardware emulators, and errors in the design are corrected.

Several steps are common to most design flows. Typically, the specification for the new circuit initially is described at a very abstract level as a logical design. An example of this type of abstract description is a register transfer level (RTL) description of the circuit. With this type of description, the circuit is defined in terms of both the exchange of signals between hardware registers and the logical operations that are performed on those signals. A register transfer level design typically employs a Hardware Design Language (HDL), such as the Very high speed integrated circuit Hardware Design Language (VHDL) or the Verilog language. The logic of the circuit is then analyzed, to confirm that the logic incorporated into the design will accurately perform the functions desired for the circuit. This analysis is sometimes referred to as "functional verification."

In some instances, the functionality of the circuit design will be verified by simulating the operation of the design using software. Some designs may be too large or complex to efficiently simulate using software, however. Instead, the functionality of the circuit design will be verified by emulating the circuit design using a hardware emulator. Examples of hardware emulators include, for example, the VELOCE family of emulators available from Mentor Graphics Corporation of Wilsonville, Oreg., the ZEBU family of emulators available from EVE SA of Palaiseau, France, and the PALLADIUM family of emulators available from Cadence Design Systems of San Jose, Calif. An emulator typically will provide a set of primitive components for emulating the operation of a circuit design. For example, emulators, some of which may use conventional field-programmable gate array circuits, emulate the functionality of a circuit design using a combination of state elements, memories and lookup tables. Of course, other types of emulators may provide additional or alternate primitive components. For example, alternatively, an emulator may function by using combinatorial elements computing a selectable function over a fixed number of inputs.

As those of skill in the art will appreciate, many modern electronic circuits are designed to communicate with peripheral devices through various communication interfaces, often referred to as "busses" using various communication protocols. Examples of communication protocols include the I$^2$C bus protocol, the C-Bus protocol, and the Serial bus protocol. Accordingly, in order to properly verify the functionality of some circuit designs using an emulator, it is often necessary to connect the emulator to a computer system to test the functionality of an emulated bus.

With some communication protocols, there is a specific time limit in which data must be made available on the bus. If the expected data is not available within the specific time period, then the communication utilizing the protocol may fail. Accordingly, communication between the emulator and the computer needs to be implemented in such a way that the emulated portions of the circuit design communicating with the computer can meet these time constraints. Adding to the complexity of meeting time constraints is the fact that it is often necessary to configure portions of the emulator with data from the computer. Furthermore, it is often necessary to generate a record of what is happening during the emulation and then "log" the record to the computer.

BRIEF SUMMARY OF THE INVENTION

Aspects of the invention relate to facilitating the interaction of software running on a computer with a portion of an electronic design being emulated on an emulator. More particularly, the invention facilities the verification of a design having a communication bus being emulated on an emulator. Furthermore, the interaction is facilitated in such a manner as to provide an appropriate latency for the emulated communication bus. According to various implementations of the invention, a protocol proxy is provided. The protocol proxy is designed to be emulated along with an electronic design and configured to communicate to software executing on a computer connected to the emulator. The protocol proxy includes a protocol module that communicates to the electronic design being emulated in the emulator environment. Furthermore, the protocol proxy includes a software control module that communicates to the software outside the emulator through proxy communication channels. Further still, the protocol proxy includes a data storage component.

In various implementations, the protocol proxy includes a log communication channel, a command communication channel and a reply communication channel. These channels are used to configure and provide operating instructions to the protocol proxy. Subsequently, the electronic design may be emulated along with the protocol proxy in order to functionally emulate the communication bus and the communication protocols of the electronic design. Subsequently, the electronic design and associated communication bus can be verified.

These and additional implementations of invention will be further understood from the following detailed disclosure of illustrative embodiments.

BRIEF DESCRIPTION OF THE DRAWINGS

The present invention will be described by way of illustrative implementations shown in the accompanying drawings in which like references denote similar elements, and in which.

DETAILED DESCRIPTION OF THE INVENTION

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "generate" to describe the disclosed implementations. Such terms are often high-level abstractions of the actual operations that are performed. The actual operations that correspond to these terms will often vary depending on the particular implementation.

Illustrative Computing Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
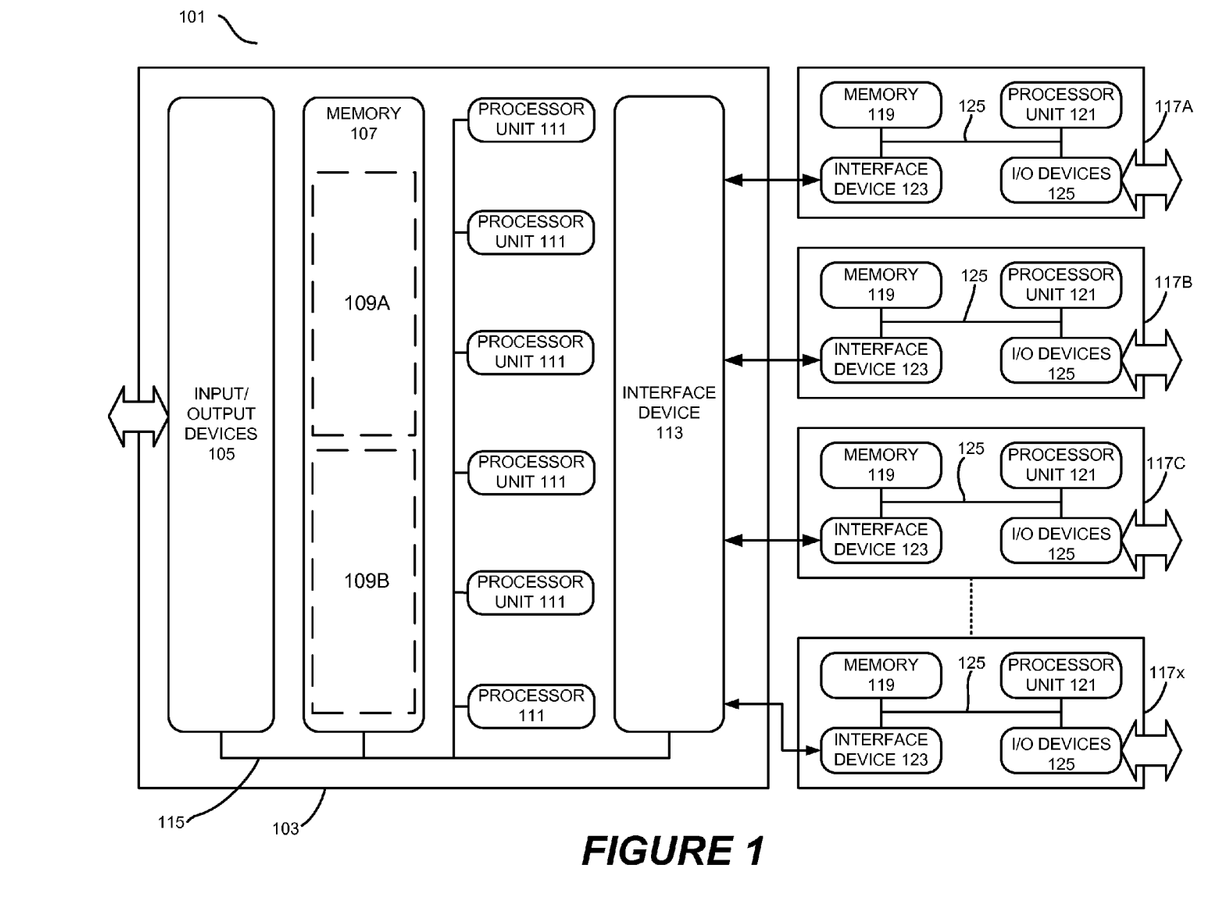
FIGS. 1 and 2 illustrate an example of a computing environment that may be employed to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. As those of skill in the art will appreciate, computer-readable storage media are inherently non-transitory in nature. More specifically, the data stored on the media may be recalled at a later time, as opposed, to being a transitory communication where the data must be received by a communication device before the transitory signal becomes unavailable.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
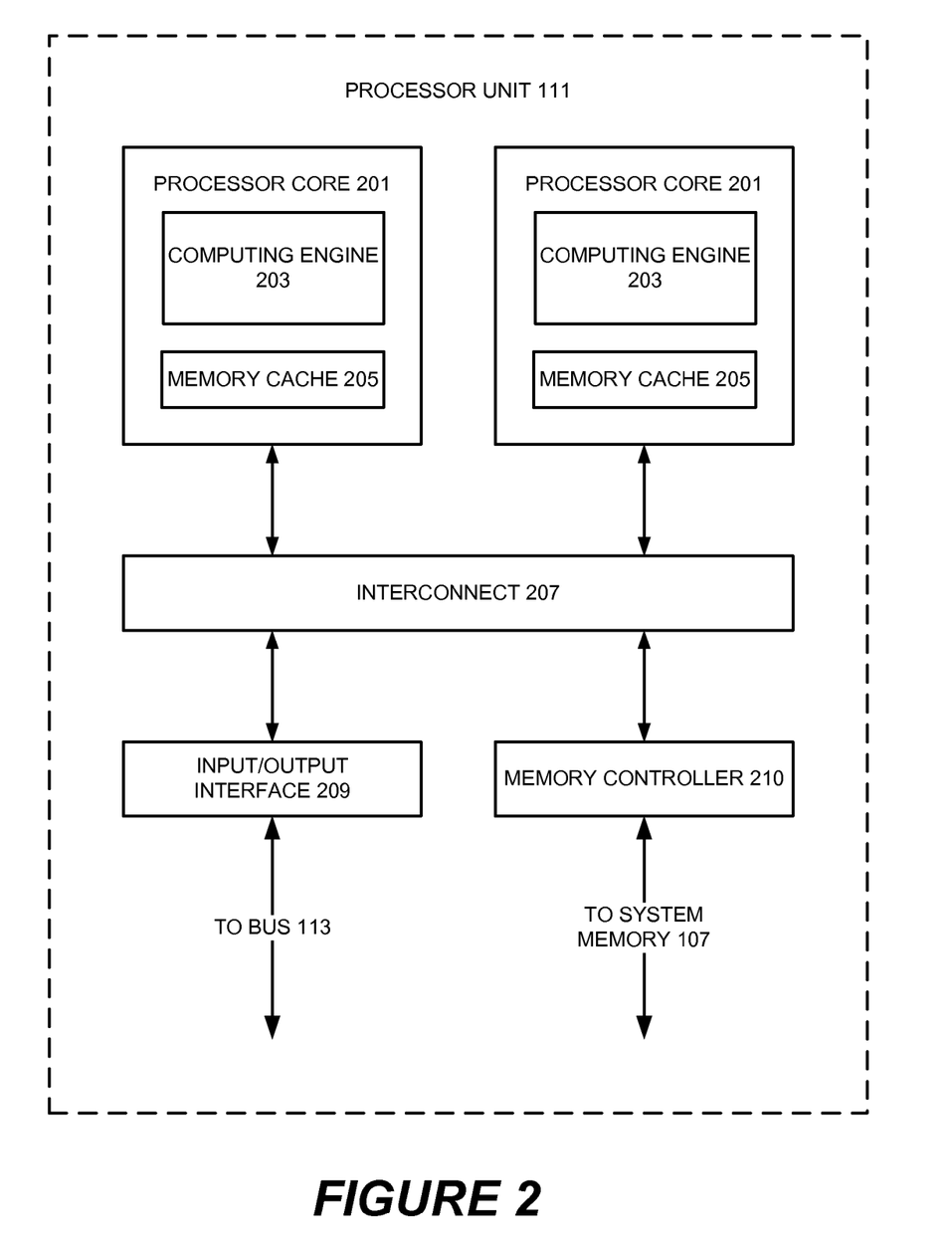

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C ... 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it is not intended to suggest any limitation as to the scope of use or functionality of alternate embodiments of the invention.

Illustrative Emulation Environment

As stated above, various implementations of the invention provide a protocol proxy for a hardware emulator. As such, the concept of hardware emulation and an illustrative emulation environment 301 are discussed herein in relation to FIGS. 3A and 3B. As can be seen from these figures, the emulation environment 301 includes an emulator 303 and a control workstation 305. The emulator 303 includes a plurality of configurable logic blocks 307, a configurable interconnect 309, a memory 311, and a communication interface 313.

Figure 3A:
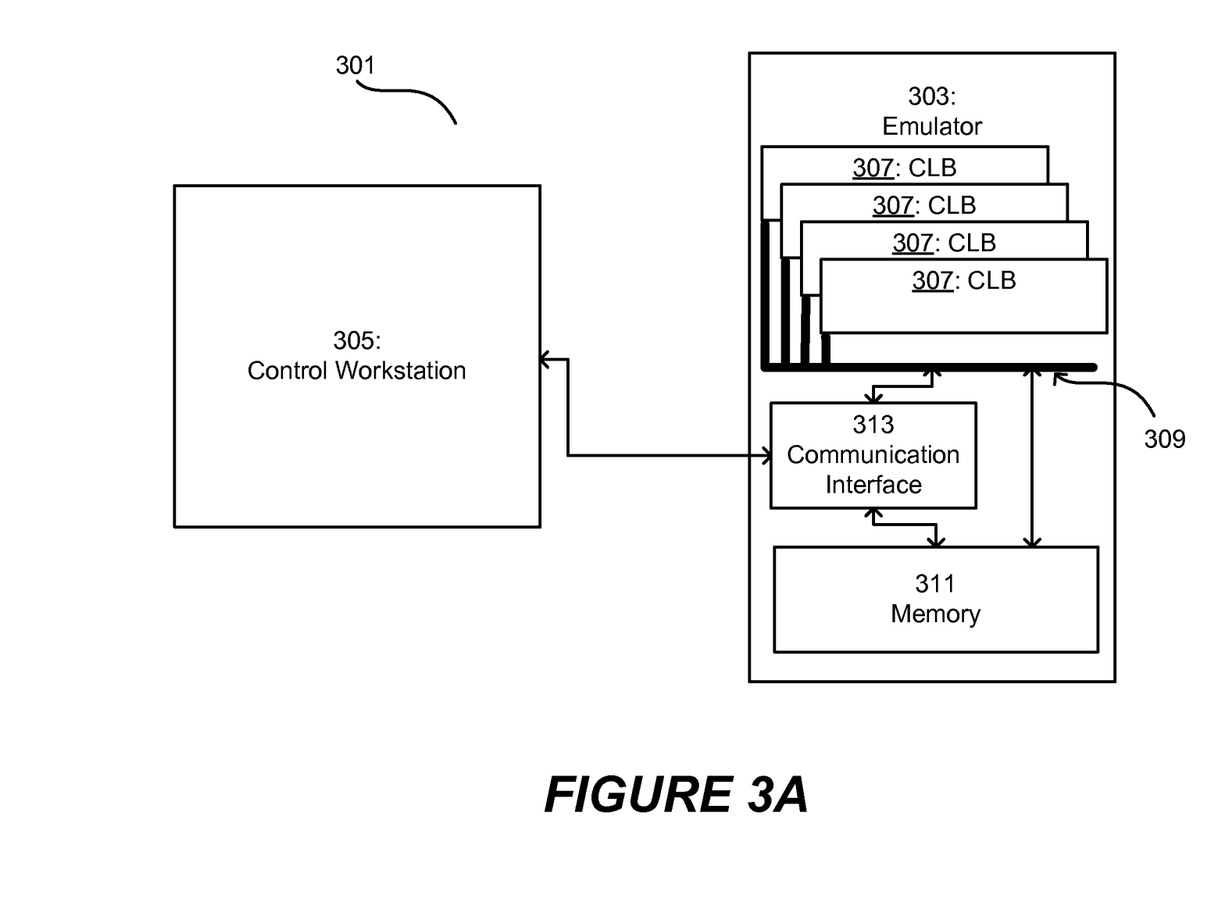
FIGS. 3A and 3B illustrate an emulation environment.
Figure 3B:
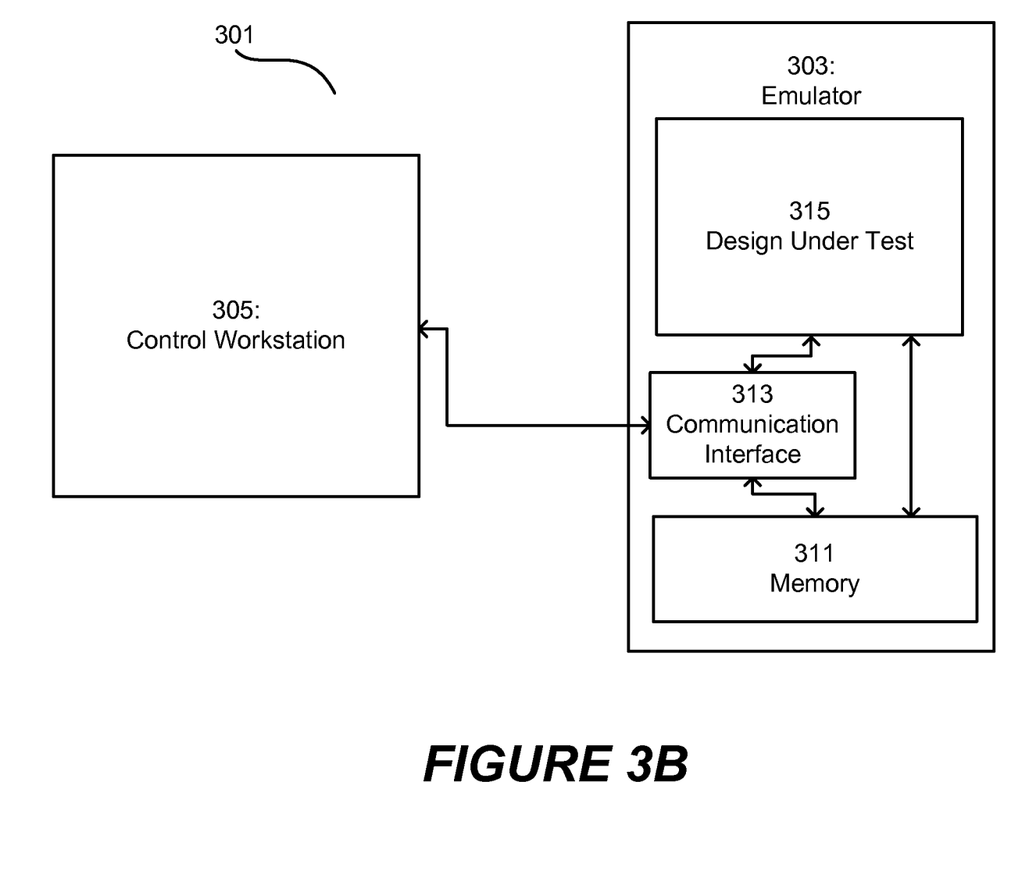

As those of skill in the art will appreciate, a number of different technologies exist for implementing the emulator 303. For example, the configurable logic blocks 307 may be field-programmable gate arrays (FPGAs). Alternatively, the configurable logic blocks may be implemented using look-up tables. Similarly, in some implementations the configurable interconnect 311 may a cross-bar device, while in alternative implementations the configurable interconnect may be a multiplexer.

In order to emulate an electronic design, such as, for example, the design for an integrated circuit, the design is first taken and compiled into another design. This compiled design is then used by the control workstation 305 to program the configurable logic blocks 307 and the configurable interconnect 309 to imitate or mimic the behavior of the electronic design. The electronic design is often referred to as the "design under test." As can be seen from FIG. 3B, the emulator 303 shows a design under test 315 as being "loaded" onto the emulator 303. Subsequently, the design under test 315 can be operated by executed of the emulator 303.

The communication interface 313 and the memory 311 are often provided to facilitate programming the emulator 303, and providing various debugging features that enable an engineer to verify the functionality of the design under test 315. For example, in some implementations, state information of the various components of the design under test during execution may be recorded by the emulator 303 in the memory 311. Furthermore, commands and responses can be passed to the control workstation 305 via the communication interface 313. For example data stored in the memory 311 may be passed to the control workstation 305.

As those of skill in the art will appreciate that a number of different technologies and techniques for implementing an emulator are known in the art. The discussion above is provided as an example only, and is not intended to be limiting.

Protocol Proxy for Hardware Emulation

A number of different communication protocols are available in the art. Furthermore, many modern electronic designs support at least one of the different communication protocols. This enables the electronic design to be connected to peripheral devices during use. In order to properly test and verify the functionality of these electronic designs, the functionality of the communication protocol must also be verified. For example, if the design under test 315 includes support for a communication protocol, the control workstation 305, or alternatively, another computer (not shown in FIG. 3A or 3B) could be connected to the emulator 303 to act as the peripheral device and communicate with the design under test 315 via the communication protocol during execution of the emulator 303. However, as detailed above, this communication is often not possible within appropriate latency periods. Furthermore, it is often necessary that data be configured prior to some communication operations. If this data is not available on the emulator, communication within appropriate latency period may not be possible.

One example of this is the I²C protocol, which allows a master device to communicate with multiple slave devices. A slave device then is required to acknowledge the communication from the master device on the next clock cycle. Various latencies due to the emulation, however, often prevent timely communication between components of the design under test 315 and the control workstation 305.

Figure 4:
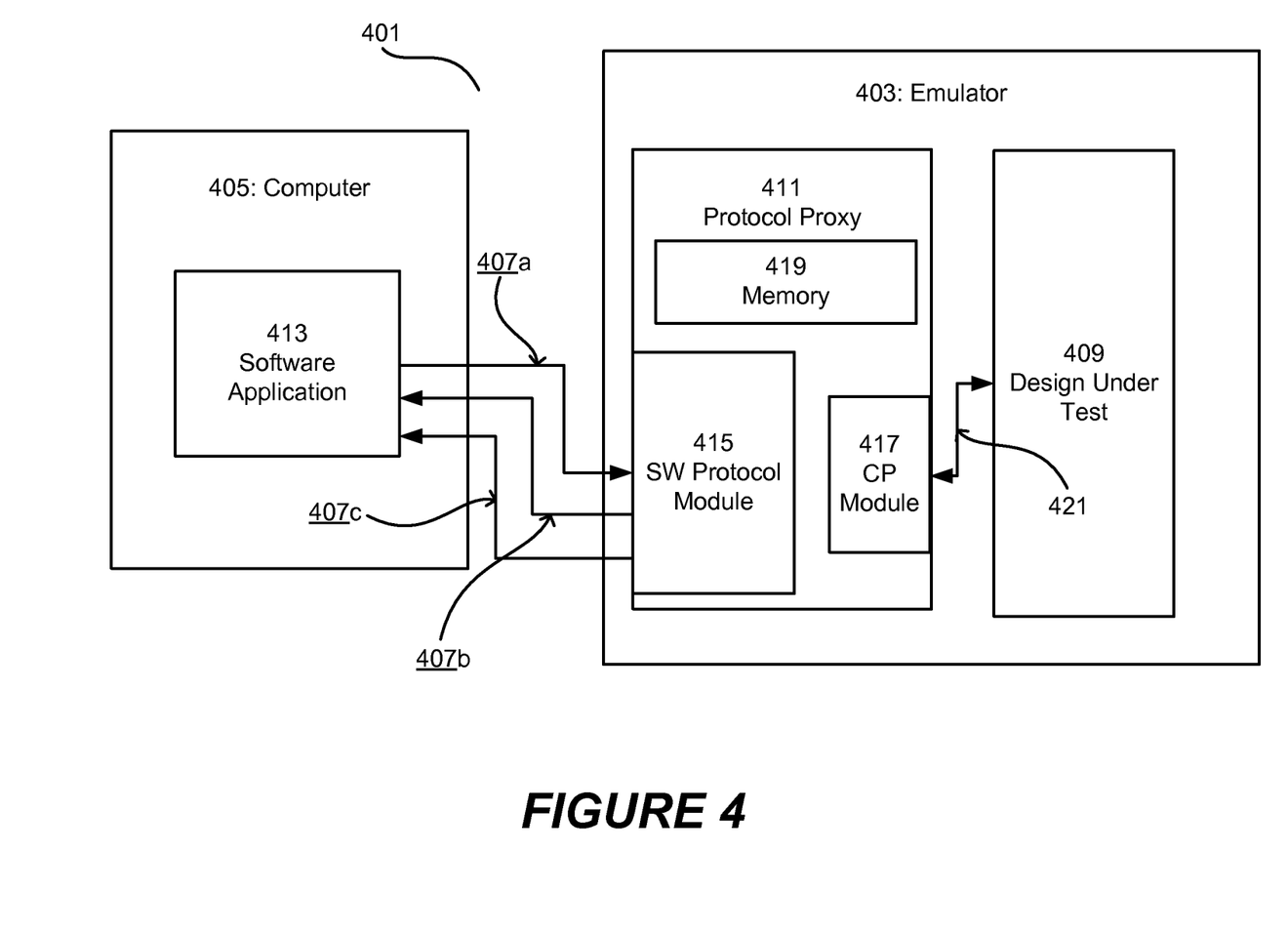
FIG. 4 illustrates an emulation environment including a protocol proxy.

Various implementations of the invention provide a protocol proxy that allows for appropriate latency during communication between a design under test and a component outside the emulator, such as, for example, software executing upon a computer that is connected to the emulator. FIG. 4 illustrates an emulation environment 401 including an emulator 403 and a computer 405 connected to each other by communication channels 407. As can be seen from this figure, the emulator 403 has a design under test 409 loaded thereon. The emulator 403 further includes a protocol proxy 411. The computer 405 has a software application 413 loaded thereon.

The protocol proxy 411 includes a software protocol module 415, which is connected to the communication channels 407, a communication protocol module 417 and a memory 419. The protocol proxy 411 is configured by the software application 413 through the communication channels 407. In various implementations, three (3) communication channels 407 are provided, as shown in FIG. 4. In alternative implementations, more or less communication channels may be utilized.

The communication protocol module 417 is connected to the design under test 409 via a communication bus 421. Accordingly, the communication protocol module 417 may communicate with the design under test 409 via the emulated communication lines and protocols comprising the communication bus 421. This enables the protocol proxy 411 to initiate communication with or respond to communication from the design under test 409 via the communication protocol module 417. As stated above, many communication protocols are known in the art, and discussion of specific requirements and specifications related to these communication protocols is not made herein, save for a few specific examples used to highlight various implementations of the invention. Applications of various implementations of the invention however, can be made to work with communication protocols not mentioned herein. Accordingly, the specific contents and makeup of the communication protocol module 417 will vary from implementation to implementation.

As stated above, many communication protocols allow for a first device to be connected to and communicate with a second device. For example, an integrated circuit acting as a master device may communicate over a communication bus with a slave device, such as, for example, an analog-to-digital converter. Accordingly, the software application 413 and the protocol proxy 411 work in conjunction with each other to form either a slave device or a master device on a communication bus. As such, the specific contents and functionality of the software application 413 may also vary depending upon the from communication protocol being tested.

With some implementations, a first communication channel 407a is provided for configuring and controlling the protocol proxy 411. A command message may be sent to the protocol proxy 411 from the software application 413 via the command channel 407a to, for example, trigger a write to a given address within the memory 419. As stated above, in many applications, various initial memory values are required to be configured prior to emulation. In many instances, these memory values must be computed by the software application 413. Accordingly, in various implementations of the invention, these initial memory values may be determined by the software application 413 and then loaded onto the memory 419 through the command channel 407a. Subsequently, during execution of the emulator 403, the memory values will be available within the appropriate latency period. As used herein, an appropriate latency period is a period, often measured in clock cycles, which satisfies the requirements of the communication protocol being tested.

For example, as stated above, in I²C applications, a response within the next clock cycle is required. As such, an appropriate latency would be one (1) clock cycle. With another protocol however, a response within three (3) clock cycles may be permitted. Accordingly, an appropriate latency in for that protocol would be three (3) clock cycles.

In many implementations, other commands may also be issued by the software application 413 to the protocol proxy 411 via the command channel 407a. For example, the protocol proxy 411 may be directed to perform an operation on the communication bus 421. More particularly, the communication protocol module 417 would perform the specified operations (e.g. a read or write operation) with the design under test 409. Furthermore, commands to read from the memory 419 within the protocol proxy 411 may also be issued over the command channel 407a.

In various implementations, a response channel 407b is provided to allow the software application 413 to receive any necessary data in response to commands issued over the command channel 407a. For example, the response channel 407b may be used to receive the data values stored in a range of memory addresses in the memory 419.

With some implementations, the software application 413 may receive various monitoring information from the protocol proxy 411 through a log channel 407c. For example, the log channel 407c may be used to alert the software application 413 when communication with the protocol proxy 411 (i.e. through the communication protocol module 417) has been initiated by the design under test 409. In another example, the log channel 407c may be used to send the status of various states within the protocol proxy 411 or the communication protocol module 417, such as, for example, when a reset signal has changed state or when a write has been initiated to the memory 419, to the software application 413.

Figure 5:
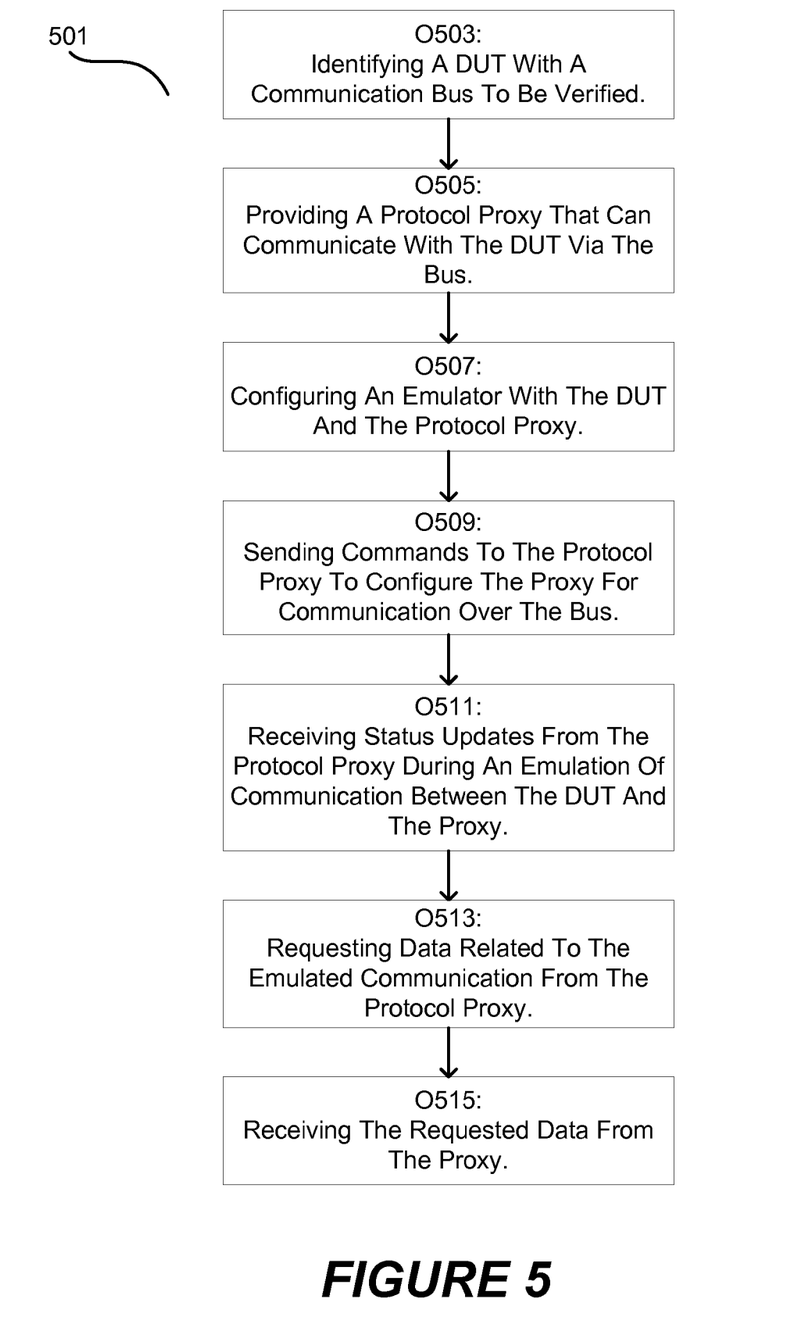
FIG. 5 illustrates a method of emulation utilizing a protocol proxy.

A method 501 of emulating an electronic design supporting a communication protocol is detailed in FIG. 5. The method is described with reference to both FIG. 5 and FIG. 4. As can be seen, the method 501 includes an operation 503 for identifying a design under test (e.g. the design under test 409) having a communication bus (e.g. the communication bus 421) to be verified, an operation 505 for providing a protocol proxy (e.g. the protocol proxy 411) that can communicate with the design under test 409 via the communication bus, an operation 507 for configuring an emulator (e.g. the emulator 403) with the design under test and the protocol proxy. As those of skill in the art will appreciate, there are various means for performing the operations described above. For example, as stated above, electronic designs are compiled into configuration code and then an emulator is configured, using the configuration code, to behave like the electronic design. Different tools and techniques exist for compiling configuration code and loading this configuration code onto an emulator. Furthermore, various levels of automation exist within these tools. As such, the operations 503, 505 and 507 are provided to give context to the balance of the method 501. In some implementations of the invention, the operations 503 through 507 may be combined into a single operation for identifying an emulator having a design under test and a protocol proxy loaded thereon.

Subsequent to having an emulator with a design under test 409 and a protocol proxy 411 loaded thereon, the method 501 includes an operation 509 for sending commands to the protocol proxy 411 to configure the proxy 411 for communication with the design under test 409 via the bus 421. For example, commands may be sent as described above using the command channel 407a. An operation 511 for receiving status updates from the protocol proxy 411 during an emulation of the communication between the design under test 409 and the protocol proxy 411, such as, for example, as described above using the log channel 407c. The method 501 also includes an operation 513 for requesting data related to the emulated communication from the protocol proxy 411, such as, for example, as described using the command channel 407a above. Additionally, an operation 515 for receiving the requested data from the proxy 411, such as, for example, as described above using the response channel 407b, is provided.

Illustrative I²C Protocol Proxy

Figure 6A:
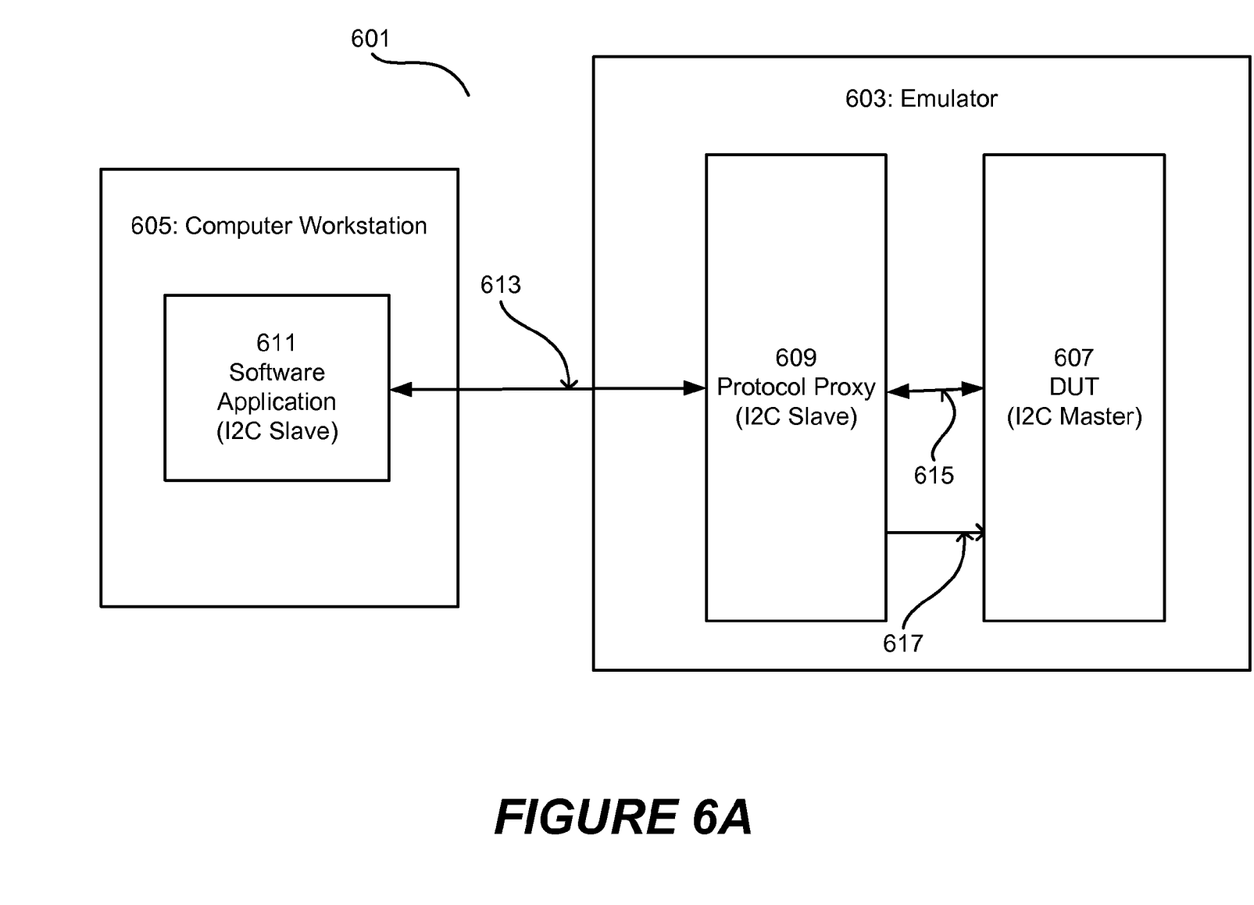
FIGS. 6A and 6B illustrate an example embodiment of an emulation environment including an I²C slave protocol proxy
Figure 6B:
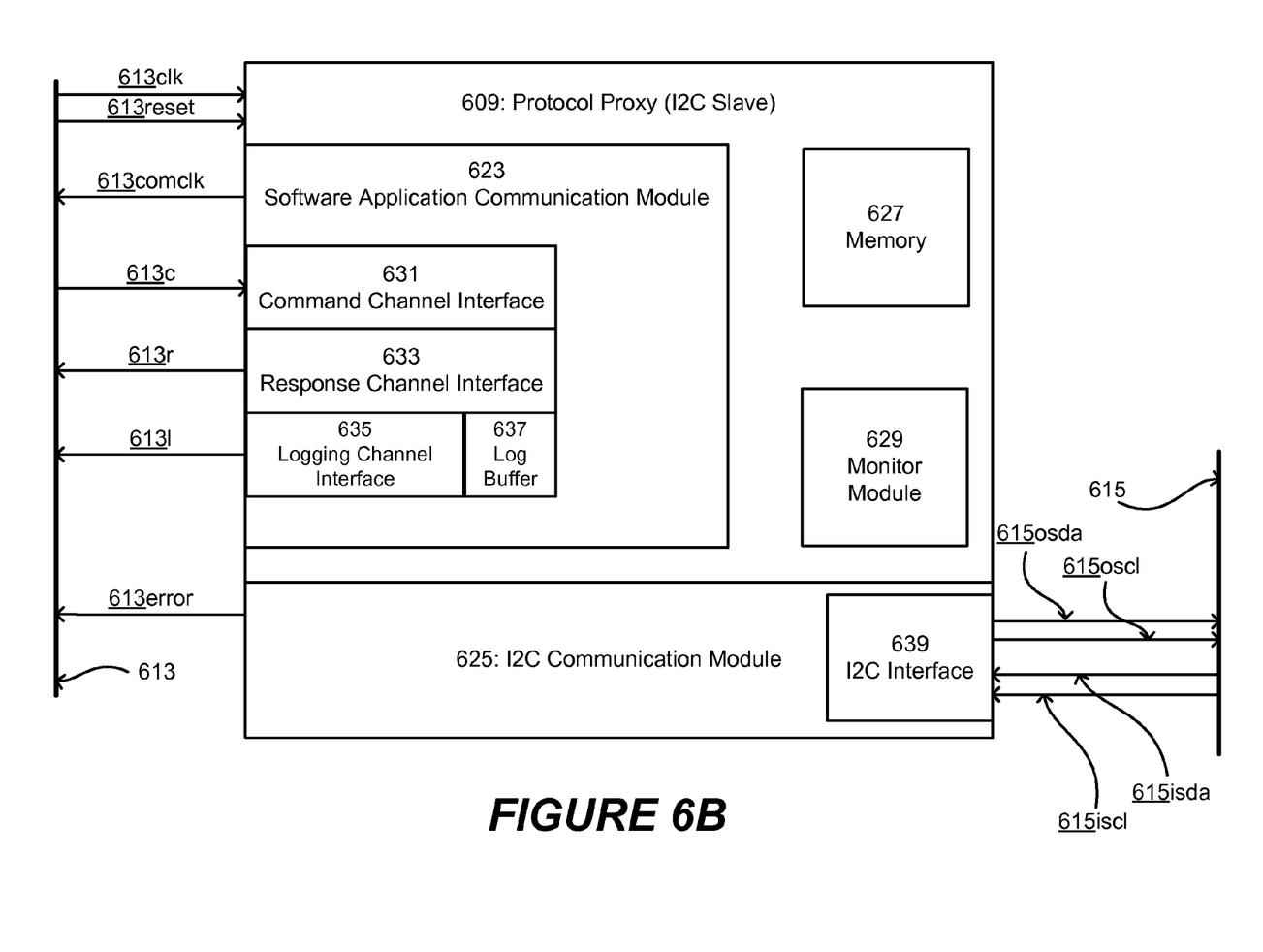

An illustrative embodiment of various implementations of the invention is described below. Specifically, a design under test, which is an I²C communication protocol master device, is shown in an illustrative emulation environment with a software application executing on a workstation that is an I²C communication protocol slave device. FIG. 6A illustrates an emulation environment 601 having an emulator 603, which includes an I²C master design under test 607 and an I²C slave protocol proxy 609. The environment 601 also includes a computer workstation 605, which has a software application 611 acting as an I²C slave device to the I²C master 607 executable thereon. FIG. 6B shows the I²C slave protocol proxy 609 in greater detail. Reference to both FIGS. 6A and 6B will be made in describing the illustrative embodiment below.

As can be seen from these figures, the protocol proxy 609 and the workstation 605 are connected through a communication channel 613 while the protocol proxy 609 is connected to the design under test 607 through an I²C communication bus 615. The protocol proxy, as shown in FIG. 6B, includes a software application communication module 623, an I²C communication module 625, a memory 627 and a monitor module 629. Furthermore, the software application communication module 623 includes a command channel interface 631, a response channel interface 633, a log channel interface 635 and a log buffer 637. Additionally, the I²C communication module 625 includes an I²C interface 639.

The monitor module 629 is configured to manage the operation of the protocol proxy 609, including the behavior of the components within the protocol proxy 609. For example, the monitor module determines when some activity over the I²C interface 639 needs to be logged to the software application 611. Additionally, the monitor module 629 determines when an error condition has been detected over the I²C interface 639 and then causes the error to be logged to the software application 611.

The I²C communication module 625 manages the high level protocol (i.e. I²C) communication. More specifically, the module 625 decides what operations to perform over the I²C bus, but however, does not perform the actual operations. More specifically, the module 625 implements the I²C communication protocol and includes features that determine when it is appropriate to communicate on the I²C bus 615, when and how to respond to communication initiated by the design under test 607 and also when to initiate communication with the design under test 607. The I²C interface 639 handles the actual communication over the I²C bus 615. As those of ordinary skill in the art will appreciate, an I²C bus has two bus lines, a serial clock line (SCL) and a serial data line (SDA). Accordingly, the I²C interface handles actually reading and writing to the I²C bus 615 over the two bus lines. FIG. 6B shown the protocol proxy connected to the I²C bus 615 via input lines 615*isda* and 615*iscl* and outputs lines 615*osda* and 615*oscl*. Input lines 615*isda* and 615*iscl* are used to read the effective levels of the I²C bus 615. Output lines 615*osda* and 615*oscl* are used to output data onto the I²C bus 615, changing the effective levels of the lines of the bus.

The memory 627 is used to model the memory of the I²C slave device. As those of skill in the art will appreciate, the memory 627 will differ depending upon the I²C slave being modeled by the protocol proxy 609. As can be further seen from these figures, the protocol proxy 609 has a synchronization connection 617 to the design under test 607. In various implementations, this connection is activated when the protocol proxy 609 has been completely configured by the software application 611. The design under test 607 in turn uses this signal to know when emulation can be started. As indicated above, in some cases the memory 627 must be configured with initial data values prior to emulation. Accordingly, the synchronization connection 617 provides a means for the protocol proxy 609 to alert the design under test 607 that is has been configured.

The software application communication module 623 manages communication between the protocol proxy 609 and the software application 611. As detailed above, the module 623 receives commands from the software application 611 and sends responses and logging information to the software application 611 through the communication channel 613. As indicated above, with some implementations the software application communication module 623 may include three main components, such as, for example, the response channel interface 633 and the logging channel interface 635 as shown. Additionally, in some implementations, the logging buffer 637 may be provided to facilitate capture and reporting of logging data. In alternative implementations, more or less components may be provided. For example, in some implementations, the command channel interface 631 and the response channel interface 633 may be combined into a single interface to receive commands from and provide responses to the software application 611.

As can be seen from these figures, a number of signals are provided from the software application 611 to the protocol proxy 609 through the communication channel 613. More specifically, a clock signal 613*clk* and a reset signal 613*reset* are provided. In some implementations, the protocol proxy 609 receives its main digital clocking signal from the software application 611, as shown in FIG. 6B. Additionally, the reset signal 613*reset* may be used to place the protocol proxy 609 in a known initial condition. A communication clock 613*comclk* is provided to synchronize the exchange of information between the software application communication module 623 and the software application 611. A bus error signal 613*error* is also provided to alert the software application 611 to an unexpected condition, such as, for example, when an error in communication on the bus is encountered.

FIG. 6B also shows a command channel 613*c*, a response channel 613*r* and a logging channel 613*l*, which are provided to allow the software application 611 to communicate with the individual interfaces within the software application communication module 623. As detailed above, various commands, such as, for example, to modify the data values of an address or addresses in the memory 627, to write something to the I²C bus 615, or to read the data values in a range of addresses in the memory 627, may be issued by the software application 611 to the protocol proxy 609 via the command channel 613*c* and the command channel interface 631. Subsequently, any necessary responses from the protocol proxy 609 may be sent to the software application 611 via the response channel interface 633 and the response channel 613*r*. Furthermore, any logs, such as, for example, when the state of one of the data lines on the I²C bus 615 changes, may be sent to the software application 611 via the logging interface 635 and the logging channel 613*l*. Various implementations of the invention provide a buffer, such as, for example, a first-in-first-out circular buffer, which allows for logging messages to be queued until prior messages have been processed.

CONCLUSION

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A system for emulating an electronic design comprising:
an emulator configured to emulate a design under test that includes a communication bus;
a protocol proxy configured to be emulated by the emulator along with the design under test and to communicate with the design under test using the communication bus, the protocol proxy including a memory component; and
a computer configured to communicate with the protocol proxy;
wherein the protocol proxy is positioned between the computer and the design under test and is configured by the computer to include data values stored in the memory component of the protocol proxy prior to emulation of the design under test, the protocol proxy being configured to use the data values to respond to communications from the design under test without communicating with the computer, thereby reducing latency during execution of the emulator;
wherein the computer communicates with the protocol proxy using a first protocol and the protocol proxy communicates with the design under test using a second protocol, different from the first protocol.

2. The system recited in claim 1, the protocol proxy comprising:
a communication protocol module; and
a software protocol module.

3. The system recited in claim 2, the software protocol module being configured to receive instructions from the computer.

4. The system recited in claim 2, the communication protocol module being configured to communicate with the design under test using the communication bus.

5. The system of claim 1, wherein the computer is configured to receive monitoring information from the protocol proxy through a log channel.

6. The system of claim 5, wherein the monitoring information includes information concerning one or more of an initiation of communication with the protocol proxy by the design under test, information concerning when a reset signal has changed state, information concerning when a write has been initiated to the memory component, or information concerning a status update.

7. The system of claim 1, wherein the software application configures the memory component in the protocol proxy through a command channel.

8. The system of claim 1, wherein the design under test models a protocol master device and wherein the protocol proxy models a protocol slave device.

9. A system for emulating an electronic design comprising:
an emulator configured to emulate a design under test;
a host computer for executing a software application; and a protocol proxy positioned in the emulator and between the design under test and the host computer, the protocol proxy including a memory component;

wherein the software application configures the memory component in the protocol proxy with data values stored prior to emulation of the design under test, and the protocol proxy uses the data values during emulation of the design under test in order to reduce latency between communications from the design under test to the protocol proxy;

wherein the software application communicates with the protocol proxy using a first protocol and the protocol proxy communicates with the design under test using a second protocol, different than the first protocol.

10. The system of claim 9, wherein the protocol proxy is configured to determine that an error condition is detected between the protocol proxy and the design under test and directs the software application to log the error condition.

11. The system of claim 9, wherein the software application is configured to receive monitoring information from the protocol proxy through a log channel.

12. The system of claim 11, wherein the monitoring information includes one or more of information concerning initiation of communication with the protocol proxy by the design under test, information concerning when a reset signal has changed state, information concerning when a write has been initiated to the memory component, or information concerning a status update.

13. The system of claim 9, wherein the design under test models a protocol master device and wherein the protocol proxy models a protocol slave device.

* * * * *